(12) United States Patent
Haase et al.

(10) Patent No.: US 12,726,215 B2
(45) **Date of Patent: *Sep. 1, 2026**

(54) APPARATUSES FOR ENCODING AND DECODING A SEQUENCE OF INTEGER VALUES, METHODS FOR ENCODING AND DECODING A SEQUENCE OF INTEGER VALUES AND COMPUTER PROGRAM FOR IMPLEMENTING THESE METHODS

(71) Applicant: Fraunhofer-Gesellschaft zur Foerderung der angewandten Forschung e.V., Munich (DE)

(72) Inventors: Paul Haase, Berlin (DE); Karsten Müller, Berlin (DE); Heiner Kirchhoffer, Berlin (DE); Detlev Marpe, Berlin (DE); Heiko Schwarz, Berlin (DE); Thomas Wiegand, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 19/323,843

(22) Filed: Sep. 9, 2025

(65) Prior Publication Data

US 2026/0012193 A1 Jan. 8, 2026

Related U.S. Application Data

(63) Continuation of application No. 18/069,342, filed on Dec. 21, 2022, now Pat. No. 12,431,916, which is a (Continued)

(30) Foreign Application Priority Data

Jun. 23, 2020 (EP) .................................... 20181776

(51) Int. Cl.
*H03M 7/40* (2006.01)

(52) U.S. Cl.
CPC ................................ *H03M 7/4075* (2013.01)

(58) Field of Classification Search
CPC ..... H03M 7/4075; H03M 7/30; H03M 7/4012
(Continued)

(56) References Cited

U.S. PATENT DOCUMENTS 7,447,372 B2 * 11/2008 Kishore .................. H03M 7/40 382/233
9,473,170 B2 10/2016 George et al.
(Continued)

FOREIGN PATENT DOCUMENTS

CA 2728938 A1 8/2011
CA 2832057 A1 1/2014
(Continued)

OTHER PUBLICATIONS

Anonymous, "Delta encoding", Wikipedia, (May 11, 2020), pp. 1-6, URL: https://en.wikipedia.org/w/index.php?title=Delta_encoding&oldid=956133407, (Sep. 10, 2021), XP055839955.
(Continued)

*Primary Examiner* — Jean B Jeanglaude
(74) *Attorney, Agent, or Firm* — Ashurst Perkins Coie US LLP; Michael A. Glenn

(57) ABSTRACT

An encoding scheme for encoding a sequence of integer values comprises first using encoding a value at a predetermined position and then consecutively calculating and encoding differences between neighboring values. A respective decoding scheme is also provided. These encoding and decoding schemes provide a more efficient encoding concept.

19 Claims, 3 Drawing Sheets

Related U.S. Application Data continuation of application No. PCT/EP2021/067217, filed on Jun. 23, 2021.

(58) Field of Classification Search
USPC ........................................................ 341/67
See application file for complete search history.

(56) References Cited

U.S. PATENT DOCUMENTS

| | | | | |
|---|---|---|---|---|
| 12,431,916 | B2 * | 9/2025 | Haase ................. | H03M 7/4075 |
| 2006/0293899 | A1 | 12/2006 | Church et al. | |
| 2013/0182757 | A1 | 7/2013 | Karczewicz et al. | |
| 2014/0177707 | A1 | 6/2014 | George et al. | |
| 2017/0302952 | A1 | 10/2017 | George et al. | |

FOREIGN PATENT DOCUMENTS

| | | | |
|---|---|---|---|
| CN | 101924562 | A | 12/2010 |
| EP | 2112765 | A1 | 10/2009 |
| JP | 2008547116 | A | 12/2008 |
| KR | 20080021044 | A | 3/2008 |
| KR | 20140119736 | A | 10/2014 |
| KR | 20140137505 | A | 12/2014 |
| WO | 2014189236 | A1 | 11/2014 |

OTHER PUBLICATIONS

Anonymous, “Minimizing the redundancy in Golomb Codes Sets . GitHub”, (May 29, 2018), pp. 1-3, URL: https://gist.github.com/sipa/576d5f09c3b86c3b1b75598d799fc845, (Sep. 13, 2021), XP055840156.

Anonymous, “Universal code (data compression)”, Wikipedia, (Aug. 19, 2019), pp. 1-3, URL: https://en.wikipedia.org/w/index.php?title=Universal_code_(data_compression)&oldid=911559940, (Sep. 10, 2021), XP055840063.

H. E. Williams et al, “Compressing Integers for Fast File Access”, Computer Journal., GB, (Mar. 1, 1999), vol. 42, No. 3, doi:10.1093/comjnl/42.3.193, ISSN 0010-4620, pp. 193-201, XP055758746.

International Search Report for PCT/EP2021/067217, mailed Sep. 24, 2021, 4 pages.

Written Opinion of the International Searching Authority for PCT/EP2021/067217, mailed Sep. 24, 2021, 9 pages.

Notice of Allowance and Decision to Grant a Patent with allowed claims in English; Nov. 25, 2024, 15 pages.

“Decision to Grant”, Machine translation retrieved at Japan Patent Office on Sep. 24, 2025; 3 pages.

“Notice of Reasons for Rejection”, Machine translation retrieved at Japan Patent Office on Sep. 24, 2025; 3 pages.

“Written Amendment and Written Opinion”, Machine translation retrieved at Japan Patent Office on Sep. 24, 2025; 20 pages.

* cited by examiner

APPARATUSES FOR ENCODING AND DECODING A SEQUENCE OF INTEGER VALUES, METHODS FOR ENCODING AND DECODING A SEQUENCE OF INTEGER VALUES AND COMPUTER PROGRAM FOR IMPLEMENTING THESE METHODS

CROSS-REFERENCES TO RELATED APPLICATIONS

This application is a continuation of U.S. patent application Ser. No. 18/069,342, filed Dec. 21, 2022, which is a continuation of copending International Application No. PCT/EP2021/067217, filed Jun. 23, 2021, which is incorporated herein by reference in its entirety, and additionally claims priority from European Application No. EP 20 181 776.4, filed Jun. 23, 2020, which is incorporated herein by reference in its entirety.

The present application is concerned with encoding a sequence of integer values, particularly by first using encoding a value at a predetermined position and then consecutively calculating and encoding differences between neighboring values.

Embodiments according to the invention are related to an apparatus for encoding a sequence of integer values.

Further embodiments according to the invention are related to an apparatus for decoding a sequence of integer values.

Further embodiments according to the invention are related to a method for encoding a sequence of integer values.

Further embodiments according to the invention are related to a method for decoding a sequence of integer values.

Further embodiments according to the invention are related to a computer program for performing methods for encoding and decoding a sequence of integer values.

The invention can be applied to arbitrary data compression applications that involve the signaling of integer values like, for example, the compression of the parameters of neural networks.

BACKGROUND OF THE INVENTION

A multitude of devices and methods for encoding and decoding of values sequences are currently known.

The known devices and methods, however, require considerable bitstream bandwidth, due to the length of the codes, and are efficient only when a small number of different values occur amongst the elements of the sequence.

In view of the above, there is a desire to create a coding concept which provides an improved compression performance, which leads to an improved coding efficiency.

Accordingly, it is the object of the present invention to provide an encoding concept which is more efficient. This object is achieved by the subject matter of the pending independent claims.

SUMMARY

An embodiment may an apparatus for decoding, from a data stream, a sequence of integer values which are ordered in a strict monotonous manner, the apparatus configured for decoding from the data stream a predetermined integer value located at a predetermined position of the sequence of integer values; and for each position of the sequence of integer values which precedes the predetermined position, decoding, from the data stream, a first difference between an integer value residing immediately following the respective position and the integer value at the respective position, reduced by 1; and for each position of the sequence of integer values which is located following the predetermined position, decoding, from the data stream, a second difference between the integer value at the respective position and an integer value residing immediately preceding the respective position, reduced by 1.

Another embodiment may have an apparatus for encoding, into a data stream, a sequence of integer values which are ordered in a strict monotonous manner, the apparatus configured for encoding into the data stream a predetermined integer value located at a predetermined position of the sequence of integer values; and for each position of the sequence of integer values which precedes the predetermined position, calculating a first difference between an integer value residing immediately following the respective position and the integer value at the respective position, reduced by 1; and encoding the first difference into the data stream; and for each position of the sequence of integer values which is located following the predetermined position, calculating a second difference between the integer value at the respective position and an integer value residing immediately preceding the respective position, reduced by 1; and encoding the second difference into the data stream.

Another embodiment may have a method for decoding, from a data stream, a sequence of integer values which are ordered in a strict monotonous manner, comprising decoding from the data stream a predetermined integer value located at a predetermined position of the sequence of integer values; and for each position of the sequence of integer values which precedes the predetermined position, decoding, from the data stream, a first difference between an integer value residing immediately following the respective position and the integer value at the respective position, reduced by 1; and for each position of the sequence of integer values which is located following the predetermined position, decoding, from the data stream, a second difference between the integer value at the respective position and an integer value residing immediately preceding the respective position, reduced by 1.

Another embodiment may have a method for encoding, into a data stream, a sequence of integer values which are ordered in a strict monotonous manner, comprising encoding into the data stream a predetermined integer value located at a predetermined position of the sequence of integer values; and for each position of the sequence of integer values which precedes the predetermined position, calculating a first difference between an integer value residing immediately following the respective position and the integer value at the respective position, reduced by 1; and encoding the first difference into the data stream; and for each position of the sequence of integer values which is located following the predetermined position, calculating a second difference between the integer value at the respective position and an integer value residing immediately preceding the respective position, reduced by 1; and encoding the second difference into the data stream.

Another embodiment may have a non-transitory digital storage medium having a computer program stored thereon to perform the method for decoding, from a data stream, a sequence of integer values which are ordered in a strict monotonous manner, comprising decoding from the data stream a predetermined integer value located at a predetermined position of the sequence of integer values; and for each position of the sequence of integer values which precedes the predetermined position, decoding, from the data stream, a first difference between an integer value residing immediately following the respective position and the integer value at the respective position, reduced by 1; and for each position of the sequence of integer values which is located following the predetermined position, decoding, from the data stream, a second difference between the integer value at the respective position and an integer value residing immediately preceding the respective position, reduced by 1, when said computer program is run by a computer.

Another embodiment may have a non-transitory digital storage medium having a computer program stored thereon to perform the method for encoding, into a data stream, a sequence of integer values which are ordered in a strict monotonous manner, comprising encoding into the data stream a predetermined integer value located at a predetermined position of the sequence of integer values; and for each position of the sequence of integer values which precedes the predetermined position, calculating a first difference between an integer value residing immediately following the respective position and the integer value at the respective position, reduced by 1; and encoding the first difference into the data stream; and for each position of the sequence of integer values which is located following the predetermined position, calculating a second difference between the integer value at the respective position and an integer value residing immediately preceding the respective position, reduced by 1; and encoding the second difference into the data stream, when said computer program is run by a computer.

An embodiment according to the invention creates an apparatus for encoding, into a data stream, for example into a bit stream, a sequence of integer values which are ordered in a strict monotonous manner, for example a codebook. The apparatus is configured for encoding into the data stream a predetermined integer value, for example C[z], located at a predetermined position (z) of the sequence of integer values; and, for each position of the sequence of integer values which precedes the predetermined position, for example z, for calculating a first difference between an integer value residing immediately following the respective position and the integer value at the respective position, reduced by 1; and for encoding the first difference into the data stream; and for each position of the sequence of integer values which is located following the predetermined position, for calculating a second difference between the integer value at the respective position and an integer value residing immediately preceding the respective position, reduced by 1; and for encoding the second difference into the data stream.

This embodiment is based on the finding that encoding a predetermined integer value of the sequence located at a predetermined position of the sequence first and then consequently signaling only the difference between the neighboring values increases a compression performance.

It is worth noting that the coding of the sequence of integer values as taught herein divides the sequence into two portions, one preceding the predetermined position, the other following the predetermined position along the sequence. Many sequences to be coded such as a codebook of quantization levels of parameter such as neural network parameters show a distribution of values centered around a certain integer value which is rather low in magnitude and which might then be used to form the predetermined integer value at the predetermined position, wherein a high density of integer values occurs around that center and large intervals are realized between consecutive integer values farther away from the center. This means that coding a predetermined integer value separately with then coding the differences (reduced by one) for the other integer values with respect to pairs of immediate neighboring integer values, compared to coding a first, or a last, integer value of the sequence with then coding all the other values differentially with respect to this first or last, helps to avoid having to code one large integer value. The corresponding saving even overcompensates the additional overhead in case of coding the information on the predetermined position in the data stream.

Further, it should be noted that in many applications, the indices used to quantize a certain population of parameters such as neural network parameters have distribution among the integer values of the codebook at which they point, which is itself centered at, or nearby, the predetermined position at which the centroid of the integer values of the sequence is. This makes it possible to efficiently re-use the information on the predetermined position, in case of being coded into the data stream, as offset for coding the quantization indices for all the parameters which point into the sequence/codebook, i.e. the index minus the predetermined position (z) may be coded/decoded for each parameter instead of the rank position of the integer value within the sequence or codebook directly. The re-use as well as the corresponding differential/offset coding of the quantization indices into the sequence/codebook, renders the coding of parameter such as neural networks, NN, parameters more efficient.

According to an embodiment, the apparatus is configured for encoding into the data stream, for example a bitstream, the number of integer values of the sequence of integer values, for example the size of the codebook, e.g. L(C), or the length of the codebook. It makes it possible to re-use the information of the size of the codebook. The encoded sequence of integer values into the data stream can be used to determine a rank of the predetermined position and the center of the codebook. According to an embodiment, the apparatus is configured for encoding into the data stream the number of integer values of the sequence of integer values by use of a first variable length code, for example A1. The first variable length code may, for example, assign shorter code words to integers with smaller magnitude. The first variable length code may, for example, be a code for unsigned integer values.

According to an embodiment, the apparatus is configured for encoding into the data stream the number of integer values of the sequence of integer values by use of an exponential Golomb code. The parameter, for example k, of the exponential Golomb code may for example control the code length assignments to different magnitudes of encoded values. Using exponential Golomb code provides a more efficient coding approach.

According to an embodiment, the apparatus is configured for encoding into the data stream an exponential Golomb code parameter for the exponential Golomb code. An improved coding efficiency is thus provided.

According to an embodiment, an exponential Golomb code parameter for the exponential Golomb code is a value of 2. It is more efficient to use a predetermined exponential Golomb code parameter for the first variable length code as only one value is encoded per the sequence of integer values, e.g. the codebook.

According to an embodiment, the apparatus is configured for encoding into the data stream the number of integer values of the sequence of integer values by binarizing the number using a first binarization code into a first binary string of one or more first bins and context-adaptive binary arithmetic coding the one or more first bins. A coding efficiency is not reduced due to a lossless binarization coding.

According to an embodiment, the apparatus is configured for encoding into the data stream an information revealing the predetermined position, for example z. It makes it possible to re-use the information on the predetermine position.

According to an embodiment, the apparatus is configured for selecting the predetermined position among several positions within the sequence of integer values and select a position out of the several positions as the predetermined position, which fulfills a predetermined criterion. For example, when the integer values of the sequence of integer values are centered around zero, the predetermined position, e.g. z, advantageously point to a value with a small magnitude to provide an efficient coding approach.

According to an embodiment, the apparatus is the predetermined criterion is a lowest bitrate for encoding the sequence of integer values into the data stream.

According to an embodiment, the apparatus is configured for calculating a third difference between a rank of the predetermined position and an integer-rounded half of the number of integer values, and encoding the third difference into the data stream. For example the third difference is calculated as $$y = z - \text{floor}\left(\frac{L(C)}{2}\right).$$

The variable y is, for example, small when z points to a position close to the middle of the sequence. An efficient coding approach is thus provided.

According to an embodiment, the apparatus is configured for encoding into the data stream the third difference by use of a second variable length code, for example A2. The second variable length code is for example a code for signed integer values.

According to an embodiment, the apparatus is configured for encoding into the data stream the third difference by use of an exponential Golomb code. The parameter, for example k, of the exponential Golomb code may for example control the code length assignments to different magnitudes of encoded values. Using exponential Golomb code provides a more efficient coding approach.

According to an embodiment, the apparatus is configured for encoding into the data stream an exponential Golomb code parameter for the exponential Golomb code. An improved coding efficiency is thus provided.

According to an embodiment, the apparatus is configured for encoding into the data stream the third difference by mapping the third difference onto a first unsigned integer according to a predefined mapping rule; and encoding the first unsigned integer using a third variable length code, for example A6.

According to an embodiment, the apparatus is configured for encoding into the data stream the unsigned integers by use of an exponential Golomb code. Using exponential Golomb code provides a more efficient coding approach.

According to an embodiment, the apparatus is configured for encoding into the data stream an exponential Golomb code parameter for the exponential Golomb code. An improved coding efficiency is thus provided.

According to an embodiment, an exponential Golomb code parameter for the exponential Golomb code is a value of 2. It could be more efficient to use a predetermined exponential Golomb code parameter.

According to an embodiment, the mapping rule maps signed integers to unsigned integers in a manner so that signed integers lower than 0 and signed integers greater than 0 are mapped onto separate ones of even unsigned integers and odd unsigned integers, respectively, with mapping zero onto zero and so that, for each unsigned integer, a first signed integer mapped onto the respective unsigned integer is, in magnitude, larger than or equal to, a second signed integer mapped onto an unsigned integer following the respective unsigned integer.

According to an embodiment, the mapping rule maps signed integers Is to unsigned integers Iu according to:

$$\text{if } Is \le 0 \rightarrow Iu = -Is * 2,$$

$$\text{if } Is > 0 \rightarrow Iu = Is * 2 - 1.$$

According to an embodiment, the apparatus is configured for encoding into the data stream the third difference by binarizing the number using a second binarization code into a second binary string of one or more second bins and context-adaptive binary arithmetic coding the one or more second bins.

According to an embodiment, the apparatus is configured for encoding into the data stream the predetermined integer value by use of a fourth variable length code, for example A3. The fourth variable length code may be for example a code for signed integer values.

According to an embodiment, the apparatus is configured for encoding into the data stream the predetermined integer value by use of an exponential Golomb code. The parameter, for example k, of the exponential Golomb code may for example control the code length assignments to different magnitudes of encoded values. Using exponential Golomb code provides a more efficient coding approach.

According to an embodiment, the apparatus is configured for encoding into the data stream an exponential Golomb code parameter for the exponential Golomb code. An improved coding efficiency is thus provided.

According to an embodiment, the apparatus is configured for encoding into the data stream the predetermined integer value by mapping the predetermined integer value onto a second unsigned integer according to a further predefined mapping rule; and encoding the second unsigned integer using a fifth variable length code, e.g. A7.

According to an embodiment, the apparatus is configured for encoding into the data stream the unsigned integers by use of an exponential Golomb code. Using exponential Golomb code provides a more efficient coding approach.

According to an embodiment, the apparatus is configured for encoding into the data stream an exponential Golomb code parameter for the exponential Golomb code. An improved coding efficiency is thus provided.

According to an embodiment, an exponential Golomb code parameter for the exponential Golomb code is a value of 7. It could be more efficient to use a predetermined exponential Golomb code parameter.

According to an embodiment, the mapping rule maps signed integers to unsigned integers in a manner so that signed integers lower than 0 and signed integers greater than 0 are mapped onto separate ones of even unsigned integers and odd unsigned integers, respectively, with mapping zero onto zero and so that, for each unsigned integer, a first signed integer mapped onto the respective unsigned integer is, in magnitude, larger than or equal to, a second signed integer mapped onto an unsigned integer following the respective unsigned integer.

According to an embodiment, the mapping rule maps signed integers Is to unsigned integers lu according to:

$$\text{if } Is \leq 0 \rightarrow Iu = -Is * 2,$$

$$\text{if } Is > 0 \rightarrow Iu = Is * 2 - 1.$$

According to an embodiment, the apparatus is configured for encoding into the data stream the predetermined integer value by binarizing the number using a third binarization code into a third binary string of one or more third bins and context-adaptive binary arithmetic coding the one or more third bins. A coding efficiency is not reduced due to a lossless binarization coding.

According to an embodiment, the apparatus is configured for encoding into the data stream the first difference by use of a sixth variable length code, for example A4. The sixth variable length code may be for example a code for unsigned integer values.

According to an embodiment, the apparatus is configured for encoding into the data stream the first difference by use of an exponential Golomb code. The parameter, for example k, of the exponential Golomb code may for example control the code length assignments to different magnitudes of encoded values. Using exponential Golomb code provides a more efficient coding approach.

According to an embodiment, the apparatus is configured for encoding into the data stream an exponential Golomb code parameter for the exponential Golomb code. This is especially efficient when two or more sequences of integer values, for example two or more codebooks, are encoded in the data stream, and only one exponential Golomb code parameter is encoded in the data stream for all sequences. In case of a larger codebook, it may be advantageous to signal the exponential Golomb parameter for the sixth variable length code in order to optimize the code lengths to the distribution of the values to be encoded. An improved coding efficiency is thus provided.

According to an embodiment, the exponential Golomb code parameter is one of values in a range from 0 to 15 and is encoded into the data stream as a 4 bit unsigned integer.

According to an embodiment, an exponential Golomb code parameter for the exponential Golomb code is a value of 7. It could be more efficient to use a predetermined exponential Golomb code parameter.

According to an embodiment, the apparatus is configured for encoding into the data stream the first difference by binarizing the number using a second binarization code into a fourth binary string of one or more fourth bins and context-adaptive binary arithmetic coding the one or more fourth bins. A coding efficiency is not reduced due to a lossless binarization coding.

According to an embodiment, the apparatus is configured for encoding into the data stream the second difference by use of a seventh variable length code, for example A5. The seventh variable length code may be for example a code for unsigned integer values.

According to an embodiment, the apparatus is configured for encoding into the data stream the second difference by use of an exponential Golomb code. The parameter, for example k, of the exponential Golomb code may for example control the code length assignments to different magnitudes of encoded values. Using exponential Golomb code provides a more efficient coding approach.

According to an embodiment, the apparatus is configured for encoding into the data stream an exponential Golomb code parameter for the exponential Golomb code. This is especially efficient when two or more sequences of integer values, for example two or more codebooks, are encoded in the data stream, and only one exponential Golomb code parameter is encoded in the data stream for all sequences. In case of a larger codebook, it may be advantageous to signal the exponential Golomb parameter for the sixth variable length code in order to optimize the code lengths to the distribution of the values to be encoded. An improved coding efficiency is thus provided.

According to an embodiment, the exponential Golomb code parameter is one of values in a range from 0 to 15 and is encoded into the data stream as a 4 bit unsigned integer.

According to an embodiment, an exponential Golomb code parameter for the exponential Golomb code is a value of 7. It could be more efficient to use a predetermined exponential Golomb code parameter.

According to an embodiment, the exponential Golomb code parameter for the exponential Golomb code for encoding the second difference is the same as the exponential Golomb code parameter for the exponential Golomb code for encoding the first difference.

According to an embodiment, the exponential Golomb code parameters for the exponential Golomb code for encoding the first difference and the second difference is the same as the exponential Golomb code parameter for the exponential Golomb code for encoding into the data stream the predetermined integer value.

According to an embodiment, the apparatus is configured for encoding into the data stream the second difference by binarizing the number using a second binarization code into a fifth binary string of one or more fifth bins and context-adaptive binary arithmetic coding the one or more fifth bins. A coding efficiency is not reduced due to a lossless binarization coding.

According to an embodiment, the apparatus is configured for obtaining the sequence of integer values via a clustering algorithm.

According to an embodiment, wherein the sequence of integer values is a codebook that is associated with parameters of a neural network. The re-use of the information on the predetermined position, in case of being coded into the data stream, as offset for coding the quantization indices for all the parameters which point into the sequence/codebook, as well as the corresponding differential/offset coding of the quantization indices into the sequence/codebook, renders the coding of neural networks, NN, parameters more efficient.

According to an embodiment, wherein the parameters comprise one or more of weights, biases and batch norm parameters of the neural network.

According to an embodiment, the apparatus is configured for obtaining the sequence of integer values by quantizing a plurality of floating point values onto a set of quantization levels which are defined by the sequence of integer values and a floating point quantization parameter.

According to an embodiment, the apparatus is configured for encoding into the data stream, for each of the plurality of floating point values, a quantization index pointing to the associated integer value within the sequence of integer values which, according to the floating point quantization parameter, is associated with a quantization level onto which the respective floating point value is quantized.

According to an embodiment, the floating point quantization parameter comprises a first signed integer quantization parameter and a second unsigned integer parameter.

According to an embodiment, the apparatus is configured for encoding the first signed integer quantization parameter into the data stream, and wherein the second unsigned integer parameter is a fixed value or the apparatus is configured to inherit the second unsigned integer parameter from another sequence of integer values or a set of sequences of integer values.

According to an embodiment, the apparatus is configured for encoding into the data stream the first signed integer quantization parameter and the second unsigned integer parameter.

According to an embodiment, the apparatus is configured for encoding the quantization index into the data stream in form of rank difference of a first rank of the position of the associated integer value within the sequence of integer values and the rank of the predetermined position.

According to an embodiment, the apparatus is configured for encoding into the data stream the rank difference by use of an eighth variable length code.

According to an embodiment, the apparatus is configured for encoding into the data stream the rank difference by use of an exponential Golomb code. The parameter, for example k, of the exponential Golomb code may for example control the code length assignments to different magnitudes of encoded values. Using exponential Golomb code provides a more efficient coding approach.

According to an embodiment, the apparatus is configured for encoding into the data stream the rank difference by binarizing the number using a binarization code into a binary string of one or more bins and context-adaptive binary arithmetic coding the one or more bins. A coding efficiency is not reduced due to a lossless binarization coding.

According to an embodiment, the apparatus is configured for encoding into the data stream a floating point quantization parameter for obtaining quantization levels out of the sequence of integer values by applying the floating point quantization parameter.

According to an embodiment, wherein the floating point quantization parameter defines a quantization step size between the quantization levels.

An embodiment according to the invention creates an apparatus for decoding, from a data stream, for example from a bitstream, a sequence of integer values which are ordered in a strict monotonous manner, for example a codebook. The apparatus is configured for decoding from the data stream a predetermined integer value, for example C[z], located at a predetermined position, for example z, of the sequence of integer values; and for each position of the sequence of integer values which precedes the predetermined position, decoding, from the data stream, a first difference between an integer value residing immediately following the respective position and the integer value at the respective position, reduced by 1; and for each position of the sequence of integer values which is located following the predetermined position, decoding, from the data stream, a second difference between the integer value at the respective position and an integer value residing immediately preceding the respective position, reduced by 1.

The apparatus for decoding according to this embodiment and the embodiments described below is based on the same considerations as the apparatus for encoding described above.

According to an embodiment, the apparatus is configured for decoding from the data stream the number of integer values of the sequence of integer values, for example the size of the codebook, e.g. L(C), or for example the length of the codebook.

According to an embodiment, the apparatus is configured for decoding from the data stream the number of integer values of the sequence of integer values by use of a first variable length code, for example A1.

According to an embodiment, the apparatus is configured for decoding from the data stream the number of integer values of the sequence of integer values by use of an exponential Golomb code.

According to an embodiment, the apparatus is configured for decoding from the data stream an exponential Golomb code parameter for the exponential Golomb code.

According to an embodiment, an exponential Golomb code parameter for the exponential Golomb code is a value of 2. According to an embodiment, the apparatus is configured for decoding from the data stream the number of integer values of the sequence of integer values by debinarizing the number via a first binarization code from a first binary string of one or more first bins and context-adaptive binary arithmetic decoding the one or more first bins from the data stream.

According to an embodiment, the apparatus is configured for decoding from the data stream an information revealing the predetermined position.

According to an embodiment, the apparatus is configured for, for each position of the sequence of positions which precedes the predetermined position, computing (206) the integer value at the respective position by linearly combining the first difference, the integer value residing immediately following the respective position and one; and for each position of the sequence of positions which is located following the predetermined position, computing (208) the integer value at the respective position by linearly combining the second difference, the integer value residing immediately preceding the respective position and one.

According to an embodiment, the apparatus is configured for decoding, from the data stream, a third difference between a rank of the predetermined position and an integer-rounded half of the number of integer values; and calculating the predetermined position based on the third difference and the number of integer values.

According to an embodiment, the apparatus is configured for decoding from the data stream the third difference via a second variable length code, for example A2.

According to an embodiment, the apparatus is configured for decoding from the data stream the third difference via an exponential Golomb code.

According to an embodiment, the apparatus is configured for decoding from the data stream an exponential Golomb code parameter for the exponential Golomb code.

According to an embodiment, the apparatus is configured for decoding from the data stream the third difference by decoding a first unsigned integer using a third variable length code, for example A6; and retrieving the third difference by inverse mapping from the first unsigned integer according to a predefined inverse mapping rule.

According to an embodiment, the apparatus is configured for decoding from the data stream the unsigned integers via an exponential Golomb code.

According to an embodiment, the apparatus is configured for decoding from the data stream an exponential Golomb code parameter for the exponential Golomb code.

According to an embodiment, an exponential Golomb code parameter for the exponential Golomb code is a value of 2.

According to an embodiment, the inverse mapping rule maps unsigned integers to signed integers in a manner so that even unsigned integers and odd unsigned integers are mapped onto separate ones of signed integers lower than 0 and signed integers greater than 0, respectively, with mapping zero onto zero and so that, for each signed integer, a first signed integer mapped onto the respective unsigned integer is, in magnitude, larger than or equal to, a second signed integer mapped onto an unsigned integer following the respective unsigned integer.

According to an embodiment, the inverse mapping rule maps unsigned integers lu to signed integers Is according to:

$$\text{if } Iu\,\&1 == 0 \rightarrow Is = \frac{-Iu}{2},$$

$$\text{if } Iu\,\&1 \mathrel{!}= 0 \rightarrow Is = \frac{Iu+1}{2}.$$

According to an embodiment, the apparatus is configured for decoding from the data stream the third difference by debinarizing the number via a second binarization code from a second binary string of one or more second bins and context-adaptive binary arithmetic decoding the one or more second bins.

According to an embodiment, the apparatus is configured for decoding from the data stream the predetermined integer value via a fourth variable length code, for example A3.

According to an embodiment, the apparatus is configured for decoding from the data stream the predetermined integer value via an exponential Golomb code.

According to an embodiment, the apparatus is configured for decoding from the data stream the predetermined integer value by decoding a second unsigned integer via a fifth variable length code, for example A7; and retrieving the predetermined integer value by inverse mapping from the second unsigned integer according to a further predefined inverse mapping rule.

According to an embodiment, the apparatus is configured for decoding from the data stream the unsigned integers via an exponential Golomb code.

According to an embodiment, the apparatus is configured for decoding from the data stream an exponential Golomb code parameter for the exponential Golomb code.

According to an embodiment, an exponential Golomb code parameter for the exponential Golomb code is a value of 7.

According to an embodiment, the inverse mapping rule maps unsigned integers to signed integers in a manner so that even unsigned integers and odd un signed integers are mapped onto separate ones of signed integers lower than 0 and signed integers greater than 0, respectively, with mapping zero onto zero and so that, for each signed integer, a first signed integer mapped onto the respective unsigned integer is, in magnitude, larger than or equal to, a second signed integer mapped onto an unsigned integer following the respective unsigned integer.

According to an embodiment, the inverse mapping rule maps unsigned integers Iu to signed integers is according to:

$$\text{if } Iu\,\&1 == 0 \rightarrow Is = \frac{-Iu}{2},$$

-continued $$\text{if } Iu\,\&1 \mathrel{!}= 0 \rightarrow Is = \frac{Iu+1}{2}.$$

According to an embodiment, the apparatus is configured for decoding from the data stream the predetermined integer value by debinarizing the number using a third binarization code from a third binary string of one or more third bins and context-adaptive binary arithmetic decoding the one or more third bins.

According to an embodiment, the apparatus is configured for encoding into the data stream the first difference by use of a sixth variable length code, for example A4.

According to an embodiment, the apparatus is configured for decoding from the data stream the first difference via an exponential Golomb code.

According to an embodiment, the apparatus is configured for decoding from the data stream an exponential Golomb code parameter for the exponential Golomb code. This is especially efficient when two or more sequences of integer values, for example two or more codebooks, are to be decoded from the data stream.

According to an embodiment, the exponential Golomb code parameter is one of values in a range from 0 to 15 and is encoded into the data stream as a 4 bit unsigned integer.

According to an embodiment, an exponential Golomb code parameter for the exponential Golomb code is a value of 7.

According to an embodiment, the apparatus is configured for decoding from the data stream the first difference by debinarizing the number using a second binarization code from a fourth binary string of one or more fourth bins and context-adaptive binary arithmetic decoding the one or more fourth bins.

According to an embodiment, the apparatus is configured for decoding from the data stream the second difference via a seventh variable length code, for example A5.

According to an embodiment, the apparatus is configured for decoding from the data stream the second difference via an exponential Golomb code.

According to an embodiment, the apparatus is configured for decoding from the data stream an exponential Golomb code parameter for the exponential Golomb code. This is especially efficient when two or more sequences of integer values, for example two or more codebooks, are to be decoded from the data stream.

According to an embodiment, the exponential Golomb code parameter is one of values in a range from 0 to 15 and is encoded into the data stream as a 4 bit unsigned integer.

According to an embodiment, an exponential Golomb code parameter for the exponential Golomb code is a value of 7.

According to an embodiment, the exponential Golomb code parameter for the exponential Golomb code for decoding the second difference is the same as the exponential Golomb code parameter for the exponential Golomb code for decoding the first difference.

According to an embodiment, the exponential Golomb code parameters for the exponential Golomb code for decoding the first difference and the second difference is the same as the exponential Golomb code parameter for the exponential Golomb code for decoding from the data stream the predetermined integer value.

According to an embodiment, the apparatus is configured for decoding from the data stream the second difference by debinarizing the number via a second binarization code from a fifth binary string of one or more fifth bins and context-adaptive binary arithmetic decoding the one or more fifth bins.

According to an embodiment, the apparatus is configured for applying a declustering algorithm to the decoded sequence of integer values.

According to an embodiment, the apparatus is wherein the sequence of integer values is a codebook that is associated with parameters of a neural network.

According to an embodiment, the parameters comprise one or more of weights, biases and batch norm parameters of the neural network.

According to an embodiment, the apparatus is configured for reconstructing the decoded sequence of integer values to a plurality of floating point values from a set of quantization levels which are defined by the sequence of integer values and a floating point quantization parameter.

According to an embodiment, the apparatus is configured for decoding from the data stream, for each of the plurality of floating point values, a quantization index pointing to the associated integer value within the sequence of integer values which, according to the floating point quantization parameter, is associated with a quantization level onto which the respective floating point value was quantized.

According to an embodiment, the floating point quantization parameter comprises a first signed integer quantization parameter and a second unsigned integer parameter.

According to an embodiment, the apparatus is configured for encoding the first signed integer quantization parameter into the data stream, and wherein the second unsigned integer parameter is a fixed value or the apparatus is configured to inherit the second unsigned integer parameter from another sequence of integer values or a set of sequences of integer values.

According to an embodiment, the apparatus is configured for encoding into the data stream the first signed integer quantization parameter and the second unsigned integer parameter.

According to an embodiment, the apparatus is configured for decoding the quantization index from the data stream based on a rank difference of a first rank of the position of the associated integer value within the sequence of integer values and the rank of the predetermined position.

According to an embodiment, the apparatus is configured for decoding from the data stream the rank difference via an eighth variable length code.

According to an embodiment, the apparatus is configured for decoding from the data stream the rank difference via an exponential Golomb code.

According to an embodiment, the apparatus is configured for decoding from the data stream the rank difference by debinarizing the number using a binarization code from a binary string of one or more bins and context-adaptive binary arithmetic decoding the one or more bins.

According to an embodiment, the apparatus is configured for decoding from the data stream a floating point quantization parameter for reconstructing the sequence of integer values from quantization levels by applying the floating point quantization parameter.

According to an embodiment, the apparatus is the floating point quantization parameter defines a quantization step size between the quantization levels.

An embodiment according to the invention creates a method for encoding, into a data stream, a sequence of integer values which are ordered in a strict monotonous manner, comprising encoding into the data stream a predetermined integer value, for example C[z] located at a predetermined position, for example z, of the sequence of integer values; and for each position of the sequence of integer values which precedes the predetermined position, calculating a first difference between an integer value residing immediately following the respective position and the integer value at the respective position, reduced by 1; and encoding the first difference into the data stream; and for each position of the sequence of integer values which is located following the predetermined position, calculating a second difference between the integer value at the respective position and an integer value residing immediately preceding the respective position, reduced by 1; and encoding the second difference into the data stream.

The method according to this embodiment is based on the same considerations as an apparatus for encoding described above. Moreover, this disclosed embodiment may optionally be supplemented by any other features, functionalities and details disclosed herein in connection with the apparatus for encoding, both individually and taken in combination.

An embodiment according to the invention creates a method for decoding, from a data stream, a sequence of integer values which are ordered in a strict monotonous manner, comprising decoding from the data stream a predetermined integer value, for example C[z] located at a predetermined position, for example z, of the sequence of integer values; and for each position of the sequence of integer values which precedes the predetermined position, decoding, from the data stream, a first difference between an integer value residing immediately following the respective position and the integer value at the respective position, reduced by 1; and for each position of the sequence of integer values which is located following the predetermined position, decoding, from the data stream, a second difference between the integer value at the respective position and an integer value residing immediately preceding the respective position, reduced by 1.

The method according to this embodiment is based on the same considerations as an apparatus for decoding described above. Moreover, this disclosed embodiment may optionally be supplemented by any other features, functionalities and details disclosed herein in connection with the apparatus for decoding, both individually and taken in combination.

An embodiment according to the invention creates a computer program having a program code for performing, when running on a computer, methods according to any of embodiments described above.

The apparatus for encoding, the apparatus for encoding, the method for encoding, the method for decoding and the computer program for implementing these methods may optionally be supplemented by any of the features, functionalities and details disclosed herein (in the entire document), both individually and taken in combination.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
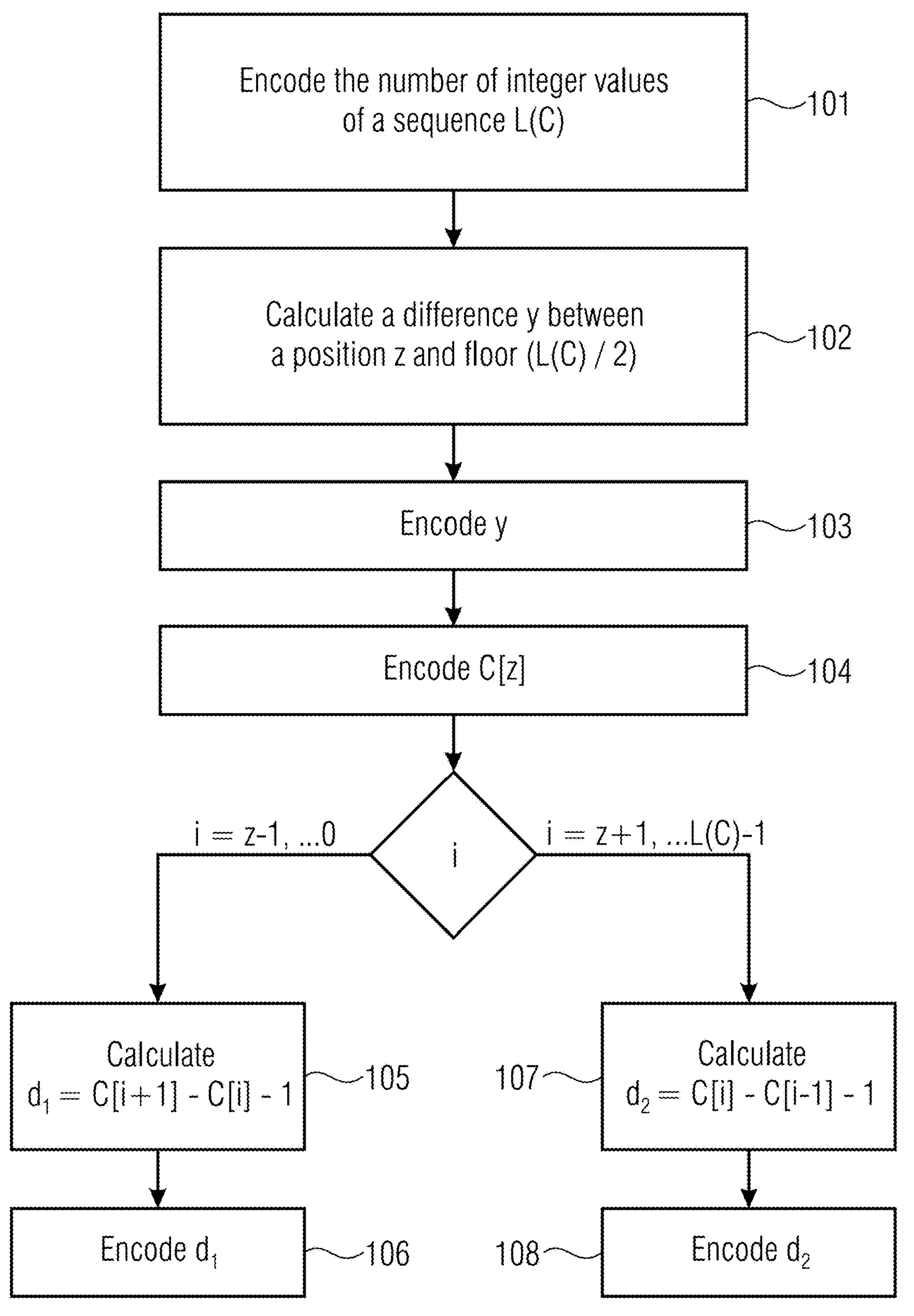
FIG. 1 shows a flow chart of a method 100 for encoding in accordance with an embodiment.

A method 100 for encoding a sequence of integer values in accordance with an embodiment is presented in FIG. 1.

The method 100 comprises encoding at step 101 a number of integer values of a sequence of integer values to be encoded, calculating at step 102 a difference between a rank of the predetermined position and an integer-rounded half of the number of integer values, and encoding at step 103 this difference into the data stream. The method 100 further comprises encoding at step 104 a predetermined integer value C[z] located at a predetermined position z of the sequence of integer values.

The method 100 further comprises performing the following encoding steps for each position of the sequence of integer values which precedes the predetermined position z: calculating at step 105 a difference between an integer value residing immediately following the respective position and the integer value at the respective position, reduced by 1, and encoding at step 106 this difference into the data stream.

The method 100 further comprises performing the following encoding steps for each position of the sequence of integer values which is located following the predetermined position z: calculating at step 107 a difference between the integer value at the respective position and an integer value residing immediately preceding the respective position, reduced by 1, and encoding at step 108 this difference into the data stream.

However, it should be noted that the method 100 may optionally be supplemented by any of the features, functionalities and details disclosed herein, both individually or taken in combination.

Figure 2:
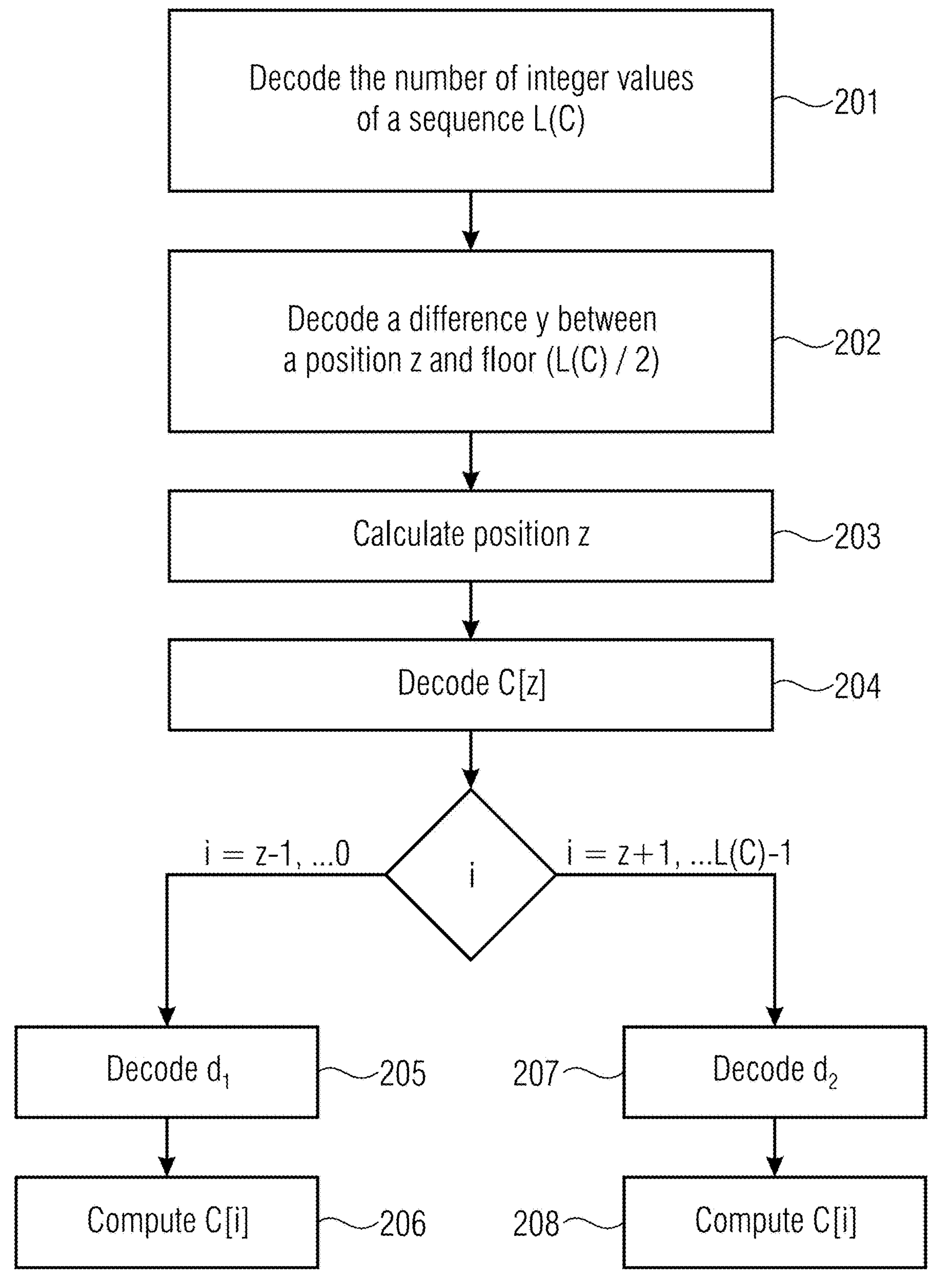
FIG. 2 shows a flow chart of a method 200 for decoding in accordance with an embodiment.

A method 200 for decoding a sequence of integer values in accordance with an embodiment is presented in FIG. 2.

The method 200 comprises decoding at step 201 from the data stream a number of integer values of a sequence L(C) of integer values to be decoded.

The method 200 further comprises decoding at step 202, from the data stream, a difference y between a rank of the predetermined position and an integer-rounded half of the number of integer values; and calculating at step 203 a predetermined position z based on the difference y and the number of integer values.

The method 200 comprises decoding at step 204 from the data stream a predetermined integer value, for example C[z], located at the calculated predetermined position z of the sequence of integer values.

The method 200 further comprises performing the following decoding steps for each position of the sequence of integer values which precedes the predetermined position: decoding at step 205, from the data stream, a difference d1 between an integer value residing immediately following the respective position and the integer value at the respective position, reduced by 1, and computing at step 206 the integer value at the respective position by linearly combining the first difference, the integer value residing immediately following the respective position and one.

The method 200 further comprises performing the following decoding steps for each position of the sequence of integer values which is located following the predetermined position: decoding at step 207, from the data stream, a difference d2 between the integer value at the respective position and an integer value residing immediately preceding the respective position, reduced by 1, and computing at step 208 the integer value at the respective position by linearly combining the second difference, the integer value residing immediately preceding the respective position and one.

However, it should be noted that the method 200 may optionally be supplemented by any of the features, functionalities and details disclosed herein, both individually or taken in combination.

In the following, several embodiments are described as to how to code a sequence 10 of integer values 12 into a data stream 14. The sequence 10 of integer values may be a codebook of quantization levels for normal network parameters. In sequence 10, the integer values 12 may be ordered in a strict monotonous manner. That is, they may be ordered in an ascending order 16 or descending order 18 with no integer value occurring more than once in sequence 10.

The integer values 12 are coded into the data stream 14 in the following manner. A predetermined integer value 12 which is indicated by hashing in FIG. 3, and which is located at a predetermined position denoted z in the following embodiment, is coded into the data stream 14 by use, for instance, a variable length code which is called A3 in the following embodiment. Thus, for the predetermined integer value, a code word 20 is comprised in data stream 14. The position z may be known by default or may, as outlined in the following embodiment, coded into the data stream 14 by use of another variable length code A2, thereby ending up into code word 22. Likewise, the size of sequence 10, i.e., the number of integer values 12 therein, may be known by default or may be, as outlined in the following embodiment, coded into data stream 14 such as by use of another variable length code called A1 in the following, thereby ending up into a code word 24.

Further, the remaining integer values 12 except the predetermined one, are coded into the data stream 14. These latter integer values 12 are coded into the data stream 14 by way of differences. For instance, the integer values 12 located upstream of the predetermined position are coded into the data stream 14 by way of differences of each of these succeeding integer values 12 on the one hand and the immediately preceding integer value of the respective integer value on the other hand. The difference is reduced by one and may be coded into the data stream 14 by use of another variable length code A5, thereby resulting into one code word 26 for each of the integer values 12 succeeding the predetermined one. Similarly, each integer value preceding the predetermined one is coded into the data stream 14 in the form of a difference between the respective integer value and the integer value immediately following the respective integer value. As described in more detail below, the difference is reduced by 1 in order to account for the fact that the integer values are ordered in the sequence 10 in a strict monotonous manner, and each difference is coded into data stream 14 using another variable length code A4, thereby resulting into a code word 28 for each of these integer values preceding the predetermined one in sequence 10.

Different possibilities exist as to how to calculate the differences using which the integer values 12 upstream and the integer values 12 downstream the predetermined integer value are computed. As described in the following embodiment, it may be that the minuend of the difference 30 on the basis of which the integer values 12 preceding the predetermined integer value are coded, is positioned subsequent to the subtrahend of the difference 30 and the same may be applied to the difference 32 using which the integer values 12 subsequent to the predetermined position are coded into data stream 14, i.e., the minuend may be positioned subsequent to the subtrahend. This is, however, only an example and the order between subtrahend and minuend may be switched for both differences 30 and 32 or on only one side of the predetermined position.

Figure 3:
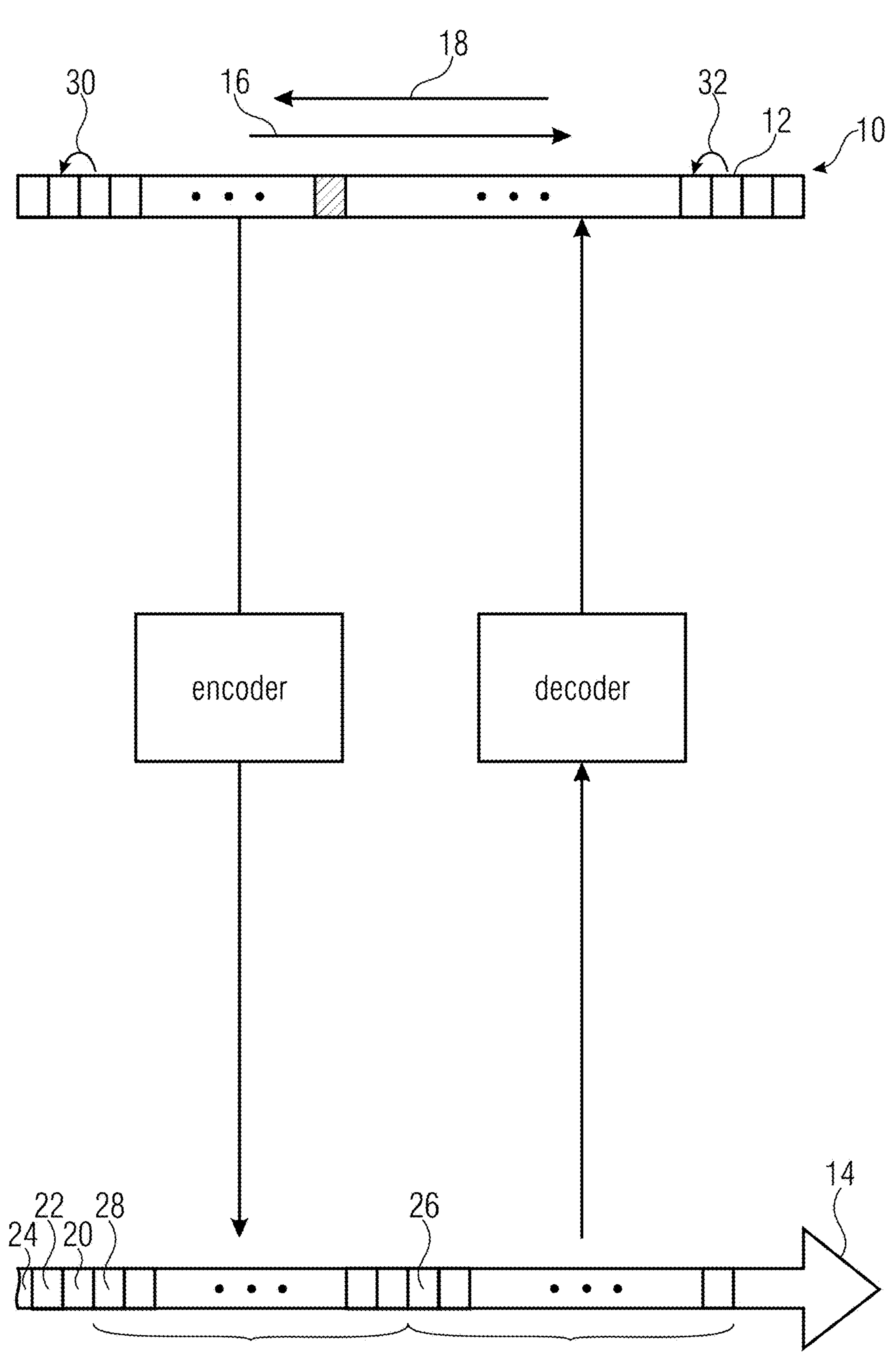
FIG. 3 shows a schematic representation of an encoding and a decoding procedures in accordance with an embodiment.

As depicted in FIG. 3, it might be that the code word resulting from the just outlined encoding procedure are coded into data stream 14 in the order so that the size of sequence 10 is coded first, than the position set of the predetermined integer value, followed by the predetermined integer value with then coding the integer values 12 preceding the predetermined position even followed by the code words 26 of the integer values 12 following the predetermined position. This is, however, only one possibility and the code words 28 and 26 could, for instance, be coded into data stream in a manner interleaved relative to each other.

As depicted in FIG. 3, the decoder reverses the coding procedure as just outlined with respect to FIG. 3 with details in this regard being set out in other embodiments.

In the following, an embodiment is described for coding a sequence of integer values in a datastream, e.g. a bitstream, e.g. in a bitstream containing encoded neural network data, e.g. in a NNR bitstream. A structure of an encoded sequence of integer values is shown in Table 1 in form of a pseudo code.

TABLE 1 integer_codebook( ) is defined as follows:

```
                                                              Descriptor
integer_codebook( cbZeroOffset, integerCodebook ) {
  codebook_egk                                                u(4)
  codebook_size                                               ue(2)
  codebook_centre_offset                                      ie(2)
  cbZeroOffset = (codebook_size >> 1 ) +
codebook_centre_offset
  codebook_zero_value                                         ie(7)
  integerCodebook[cbZeroOffset] =
codebook_zero_value
  previousValue = integerCodebook[cbZeroOffset]
  for( j = cbZeroOffset − 1; j >= 0; j−− ) {
    codebook_delta_left                                       ue(codebook_egk)
    integerCodebook[j] = previousValue −
codebook_delta_left − 1
    previousValue = integerCodebook[j]
  }
  previousValue = integerCodebook[cbZeroOffset]
  for( j = cbZeroOffset + 1; j < codebook_size; j++ ) {
    codebook_delta_right                                      ue(codebook_egk)
    integerCodebook[j] = previousValue +
codebook_delta_right + 1
    previousValue = integerCodebook[j]
  }
}
```

As could be seen in Table 1, the sequence of integer values to be encoded are contained in the vector integerCodebook where they are ordered in a strict monotonous manner. For encoding, the encoder encodes into the data stream a predetermined integer value, codebook_zero_value, located at a predetermined position, cbZeroOffset, of the sequence of integer values. The positions of the sequence of integer values, which precede the predetermined position, cbZeroOffset, are coded first in the first for-loop. In particular, for each such position j, a first difference between an integer value residing immediately following the respective position, here stored in previousValue as the for-loop traverses these positions towards the beginning of the sequence of integer values, and the integer value at the respective position, integerCodebook[j], reduced by 1 is calculated and the first difference is coded into the data stream, i.e. codebook_delta_left=previousValue−integerCodebook[j]−1. Then, the positions of the sequence of integer values, which are located following the predetermined position, are coded first in the second for-loop. For each such position of the sequence of integer values, a second difference between the integer value at the respective position, integerCodebook [j], and an integer value residing immediately preceding the respective position, here stored in previousValue as the for-loop traverses these positions towards the end of the sequence of integer values and is initialized with the predetermined integer value, codebook_zero_value, right before the second for-loop, reduced by 1, is calculated and the second difference is coded into the data stream, i.e. codebook_delta_right=integerCodebook[j]−previousValue−1. As mentioned before, the order among coding the differences could be switched or even be interleaved. For decoding the sequence of integer values, the predetermined integer value, codebook_zero_value, located at the predetermined position, cbZeroOffset, of the sequence of integer values is decoded from the data stream. Then, for each position of the sequence of integer values which precedes the predetermined position, a first difference between an integer value residing immediately following the respective position and the integer value at the respective position, reduced by 1, is decoded from the data stream, i.e. codebook_delta_left=previousValue−integerCodebook[j]−1, and for each position of the sequence of integer values which is located following the predetermined position, a second difference between the integer value at the respective position and an integer value residing immediately preceding the respective position, reduced by 1, is decoded from the data stream, namely codebook_delta_right=integerCodebook[j]−previousValue−1.

In more detail, the number of integer values of the sequence of integer values is also coded into data stream, namely codebook_size. Thus is done using a variable length code, namely a 2-th order Exp-Golomb code.

Information on the predetermined position, codebook_centre_offset, of the encoded sequence of integer values may be also coded into the data stream. This coding is done differentially relative to the sequence's mid position. That is, cbZeroOffset−(codebook_size>>1)=codebook_centre_offset is coded, i.e. a difference between a rank of the predetermined position, cbZeroOffset, and an integer-rounded half, here a rounded off half, of the number of integer values, namely codebook_size>>1. Thus is done using a variable length code, namely a 2-th order Exp-Golomb code.

The predetermined integer value, codebook_zero_value, is coded using an 7-th order Exp-Golomb code.

The first and second differences are coded using a k-th order Exp-Golomb code with k being coded into the data stream as codebook_egk. It is coded as a 4 bit unsigned integer.

An encoded sequence of integer values, e.g. a codebook, (integer_codebook) is defined by variables cbZeroOffset and integerCodebook−a predetermined position of the sequence of integer values, e.g. z, and a predetermined integer value located at the predetermined position, e.g. C(z).

Parameters defining the sequence, e.g. the codebook, include an exponential Golomb code parameter, e.g. an Exp-Golomb code parameter, e.g. k, (codebook_egk) and a number of integer values of the sequence of integer values, e.g. a number of elements in the codebook, (codebook_size). These parameters are decoded from the data stream, e.g. the bitstream, to be used in creating a decided sequence of integer values.

The predetermined position (cbZeroOffset) is a variable (codebook_centre_offset) calculated using a difference (codebook_centre_offset) between a rank of the predetermined position and an integer-rounded half of the number of integer values, which is encoded in a bitstream. The variable codebook_centre_offset is defined as a third difference, e.g. y, in an embodiment. The variable codebook_centre_offset specifies an offset for accessing integer values in the sequence, e.g. elements in the codebook, relative to the centre of the sequence, e.g. the codebook. The difference (codebook_centre_offset) is decoded from the data stream, e.g. the bitstream, to be used in creating a decided sequence of integer values.

Parameter codebook_zero_value defining the encoded sequence, e.g. the codebook, specifies the predetermined integer value (integerCodebook) located at the predetermined position (cbZeroOffset), e.g. the value of the codebook at position CbZeroOffset. This parameter is involved in creating a decoded sequence of integer values, e.g. a variable Codebook (the array representing the codebook).

In creating a decoded sequence a first difference (codebook_delta_left) and a second difference (codebook_delta_right) are decoded from the data stream, e.g. the bitstream.

The first difference (codebook_delta_left) specifies a difference between an integer value residing immediately following the respective position and the integer value at the respective position, reduced by 1 for each position of the sequence of integer values which precedes the predetermined position (cbZeroOffset), e.g. the difference between a codebook value and its right neighbour minus 1 for values left to the centre position. The first difference (codebook_delta_left) is involved in creating the decoded sequence of integer values, e.g. a variable Codebook (the array representing the codebook), as shown in Table 1. For each position of the sequence of positions which precedes the predetermined position (cbZeroOffset), the integer value at the respective position is computed by linearly combining the first difference (codebook_delta_left), the integer value residing immediately following the respective position (previousValue=integerCodebook[j+1]) and one:

$$\text{integerCodebook}[j] = \text{previousValue} - \text{codebook\_delta\_left} - 1.$$

The second difference (codebook_delta_right) specifies a difference between the integer value at the respective position and an integer value residing immediately preceding the respective position, reduced by 1 for each position of the sequence of integer values which is located following the predetermined position (cbZeroOffset), e.g. the difference between a codebook value and its left neighbour minus 1 for values right to the centre position. The second difference is involved in creating the decoded sequence of integer values, e.g. a variable Codebook (the array representing the codebook), as shown in Table 1. For each position of the sequence of integer values which is located following the predetermined position (cbZeroOffset), the integer value at the respective position is computed by linearly combining the second difference (codebook_delta_right), the integer value residing immediately preceding the respective position (previousValue=integerCodebook[j−1]) and one:

$$\text{integerCodebook}[j] = \text{previousValue} - \text{codebook\_delta\_right} + 1.$$

The exponential Golomb code parameter (codebook_egk) is used for decoding of syntax elements codebook_delta_left defining the first difference and codebook_delta_right defining the second difference.

However, it should be noted that coding a sequence of integer values as described referring to Table 1 may optionally be supplemented by any of the features, functionalities and details disclosed herein, both individually or taken in combination.

To conclude, embodiments according to the invention provide an improved compression performance leading to an improved coding efficiency.

FURTHER EMBODIMENTS AND ASPECTS

In the following, further aspects and embodiments according to the invention will be described, which can be used individually or in combination with any other embodiments disclosed herein.

Moreover, the embodiments disclosed in this section may optionally be supplemented by any other features, functionalities and details disclosed herein, both individually and taken in combination.

Improved concept for signaling a codebook for data compression in accordance with an embodiment of the invention is further described.

This embodiment according to the invention describes, for example, an approach for encoding and decoding of a codebook which may achieve an improvement in terms of compression efficiency compared to the state-of-the-art. The embodiment according to the invention can be applied to arbitrary data compression application that involve the signaling of integer values like, for example, the compression of the parameters of neural networks.

Consider a sequence of integer values W that shall efficiently be encoded by employing a codebook. This can be particularly efficient when only a small number of different values occur amongst the elements of W. For example, a W with such properties could be the output of the well-known k-means algorithm followed by a quantization of the cluster centers. In this case, the cluster centers comprise a codebook C.

A codebook C shall be a sequence of integer values that are in ascending order where a particular integer value may occur at most once. Furthermore, let z be an integer offset pointing to the z-th element of the codebook which can, for example, be understood as an offset to a codebook value equal or close to zero.

In order to use the codebook, W is translated into a sequence of codebook indexes V so that an element w_i of W equals the codebook element at position z+v_i where v_i is the element of V at position i (the first position being at i=0).

Example:

Let C=[−20, −5, 3, 17], let z=2, and let V=[−2, −2, 1, 0, −1]. Then W can be reconstructed from C, z, and V yielding sequence [−20, −20, 17, 3, −5].

In the following the embodiment according to the Invention will be described.

An efficient approach for encoding and decoding codebooks, e.g. represented as a sequence of integer values ordered in a strict monotoneous manner, is presented. It may be particularly efficient when the elements of the codebook, e.g. integer values if the sequence of integer values, are centered around zero and when z, e.g. a predetermined position, advantageously points to a value with a small magnitude. However, it will also work when these assumptions don't apply. The basic idea is to first signal the element at position z, e.g. a predetermined position, and then consecutively signal only the differences between neighboring values as follows:

1. Encode the size of the codebook L(C), e.g. the number of integer values of the sequence of integer values, using a code A1, e.g. a first variable length code, for unsigned integer values.
2. Calculate a variable y=z−floor(L(C)/2), a.g. a third difference between a rank of the predetermined position and an integer-rounded half of the number of integer values, and encode y, e.g. the third difference, using a code A2, e.g. a second variable length code, for signed integer values. Note that y is small when z points to a position close to the middle of the codebook.
3. Encode C[z], e.g. a predetermined integer value, using a code A3, e.g. a fourth variable length code, for signed integer values.
4. For each of the positions i=z−1, i=z−2, . . . i=0, e.g. the positions of the sequence of integer values preceding the predetermined position, do the following:
   a. Calculate the difference d=C[i+1]−C[i]−1, e.g. a first difference, between C[i+1] and C[i] reduced by 1 (because neighboring values in the codebook differ in magnitude at least by 1).
   b. Encode d, e.g. the first difference, using a code A4, e.g. a sixth variable length code, for unsigned integer values.
5. For each of the positions i=z+1, i=z+2, . . . until i=L(C)−1 with L(C) being the length of the codebook, e.g. the positions of the sequence of integer values following the predetermined position, do the following:
   a. Calculate the difference d=C[i]−C[i−1]−1, e.g. a second difference, between C[i] and C[i−1] reduced by 1 (because neighboring values in the codebook differ in magnitude at least by 1).
   b. Encode d, e.g. the second difference, using a code A5, e.g. a seventh variable length code, for unsigned integer values.

The corresponding decoding method is given as follows:

1. Decode a variable I, e.g. the number of integer values, using a code A1, e.g. a first variable length code, for unsigned integer values and initialize an empty codebook, e.g. a sequence of integer values with the number I of integer values, of length I. I.e. the length of the codebook L(C) equals I.
2. Decode a variable y, e.g. a third difference, using a code A2, e.g. a second variable length code, for signed integer values and set z, e.g. a predetermined position, to floor(L(C)/2)+y.
3. Decode the value of C[z], e.g. a predetermined integer value located at a predetermined position, using a code A3, e.g. a fourth variable length code, for signed integer values.
4. For each of the positions i=z−1, i=z−2, . . . i=0, e.g. the positions of the sequence of integer values preceding the predetermined position, do the following:
   a. Decode a value d, e.g. the first difference, using a code A4, e.g. a sixth variable length code, for unsigned integer values.
   b. Set C[i] to C[i+1]−d−1.
5. For each of the positions i=z+1, i=z+2, . . . until i=L(C)−1 with L(C), e.g. the positions of the sequence of integer values following the predetermined position, being the length of the codebook do the following:
   a. Decode a value d, e.g. the second difference, using a code A5, e.g. a seventh variable length code, for unsigned integer values.
   b. Set C[i] to C[i−1]+d+1.

The codes A1 to A5 can for example be fixed length codes or codes that assign shorter code words to integers with smaller magnitude. An advantage of the above encoding and decoding methods is that the values encoded with codes A1 to A5 tend to have a small magnitude which results in a shorter bitstream.

For example, the well-known exponential Golomb codes can be used for this purpose where the associated exponential Golomb parameter k controls the code length assignments to different magnitudes of encoded values. In this case, the parameters k are either predetermined values or they are signalled in the bitstream. In the case of a larger codebook, it may be rewarding to signal the exponential Golomb parameters for codes A4 and A5 in order to optimize the code lengths to the distribution of the values to be encoded. On the other hand, it may be more efficient to use predetermined exponential Golomb parameters k for codes A1, A2, and A3 as only one value is encoded per codebook.

For example, a 4 bit value can be written to the bitstream indicating an integer between 0 and 15 that shall be the exponential Golomb parameter k for codes A4 and A5.

In another example the well-known DeepCABAC scheme for encoding of signed integers may be used for any of the codes A1 to A5. Optionally, in the case of the unsigned codes, the sign_flag of DeepCabac is not encoded. Instead it is assumed to be 0 in encoder and decoder (indicating a positive value).

EXEMPLARY CONFIGURATION

In an exemplary configuration, the embodiment according to the invention is applied to the encoding of codebooks that are associated with parameters of a neural network.

In the encoder, codebooks are, for example, produced by a clustering algorithm like k-means. Then, the values in the codebook are quantized to integers employing uniform reconstruction quantization involving a step size parameter (e.g. a floating point value).

Next, the quantized codebook values are sorted in ascending order and potential duplicate values are removed.

Next, the quantized codebook is encoded by employing the scheme of this embodiment according to the invention and the integer offset z is skillfully selected.

Next, the parameters (to be encoded) are translated to codebook indexes and these codebook indexes are encoded with the well-known DeepCABAC scheme.

Note that the skillful selection of the integer offset z may, for example, be the result of minimizing the sum of the bits produced by encoding of the codebook and the associated DeepCABAC-encoded codebook indexes.

The step size may, for example, be a floating point value that is derived from a first signed integer quantization parameter QP and a second unsigned integer parameter qp_density where QP and/or qp_density are either predetermined values or are they signaled in the bitstream.

The step size "stepSize" may, for example be calculated by the following equations:

$$mul = (1 << \text{qp\_density}) + (QP \,\&((1 << \text{qp\_density}) - 1))$$

$$\text{shift} = QP >> \text{qp\_density}$$

$$\text{stepSize} = mul * 2^{shift-qp\_density}$$

In the decoder, the codebook and the codebook-indexes are decoded from the bitstream. The decoded codebook indexes are first reconstructed to quantized codebook elements (by using the codebook as a lookup table with integer offset z) and then they are reconstructed (e.g. to floating point values) employing the step size yielding the reconstructed neural network parameters.

Neural network parameters can, for example, be weights, biases, batch norm parameters, etc.

ADVANTAGEOUS EMBODIMENTS

In an advantageous embodiment, codes A1 to A5 are variable length codes that assign shorter code words to integers with smaller magnitude.

In another advantageous embodiment code A2 or code A3 is a code that first maps signed integers s to unsigned integers u according to a mapping rule M and then encodes the unsigned integers u using a code A6 or A7, respectively.

In another advantageous embodiment the mapping rule m M maps signed integers s to unsigned integers u according to the following equation:

$$\text{If } s <= 0\text{: } u = -s*2,$$

$$\text{otherwise } (s > 0)\text{: } u = s*2-1$$

The corresponding inverse mapping (as to be used in the decoder) is given as:

$$\text{If } u \text{ is even } ((u \& 1) == 0)\text{: } s = -u/2,$$

$$\text{otherwise } ((u \& 1) != 0)\text{: } s = (u+1)/2$$

In another advantageous embodiment codes A4 and A5 are the same.

In another advantageous embodiment, code A1 or code A4 or code A5 or code A6 or code A7 is an exponential Golomb code of order k.

Note that an exponential Golomb code of order k for encoding an unsigned integer u is given as follows:

```
while u >= (1<<k)
{
writeBits(1, 0)
u -= 1<<k
k +=1
}
writeBits(1, 1)
writeBits(k, u)
```

Function writeBits(n,x) writes the n least significant bits of an unsigned integer x to the bitstream.

In another advantageous embodiment, parameters k of some or all involved exponential Golomb codes are signalled in the bitstream.

In another advantageous embodiment, one or more of the codes A1 to A7 employ arithmetic coding.

In another advantageous embodiment, codes A1, A6, and A7 are exponential Golomb codes of orders 2, 2, and 7, respectively.

In another advantageous embodiment according to the previous advantageous embodiment, codes A4 and A5 are exponential Golomb codes of the same order k and k is signalled in the bitstream as a 4 bit unsigned integer allowing values 0<=k<16.

In another advantageous embodiment, codes A4 and A5 are exponential Golomb codes of orders 7.

To conclude, embodiments according to the invention provide an improved tradeoff between a compression performance and a visual quality and a low encoding latency, which leads to an improved coding efficiency. Some embodiments also provide an additional coding efficiency.

Different inventive embodiments and aspects are described, for example, in the chapters "Introduction", "Sample Adaptive Offset", "Classification for PSAO", "Decoder", "Encoder" and "Some Comments", wherein features, functionalities and details from the chapter "Sample Adaptive Offset" may optionally be introduced into any of the other embodiments.

However, the features, functionalities and details described in any other chapters can also, optionally, be introduced into the embodiments according to the present invention.

Also, the embodiments described in the above mentioned chapters can be used individually, and can also be supplemented by any of the features, functionalities and details in another chapter.

Also, it should be noted that individual aspects described herein can be used individually or in combination. Thus, details can be added to each of said individual aspects without adding details to another one of said aspects.

In particular, embodiments are also described in the claims. The embodiments described in the claims can optionally be supplemented by any of the features, functionalities and details as described herein, both individually and in combination.

It should also be noted that the present disclosure describes, explicitly or implicitly, features usable in a video encoder (apparatus for providing an encoded representation of an input video signal) and in a video decoder (apparatus for providing a decoded representation of a video signal on the basis of an encoded representation of a video signal). Thus, any of the features described herein can be used in the context of a video encoder and in the context of a video decoder.

Moreover, features and functionalities disclosed herein relating to a method can also be used in an apparatus (configured to perform such functionality). Furthermore, any features and functionalities disclosed herein with respect to an apparatus can also be used in a corresponding method. In other words, the methods disclosed herein can be supplemented by any of the features and functionalities described with respect to the apparatuses.

Also, any of the features and functionalities described herein can be implemented in hardware or in software, or using a combination of hardware and software, as will be described in the section "implementation alternatives".

IMPLEMENTATION ALTERNATIVES

Although some aspects are described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus for decoding, from a data stream, a sequence of integer values which are ordered in a strict monotonous manner, the apparatus configured for decoding from the data stream a predetermined integer value located at a predetermined position of the sequence of integer values; and for each position of the sequence of integer values which precedes the predetermined position, decoding, from the data stream, a first difference between an integer value residing immediately following the respective position and the integer value at the respective position, reduced by 1; and for a position of the sequence of integer values which is located following the predetermined position, decoding, from the data stream, a second difference between the integer value at the respective position and an integer value residing immediately preceding the respective position, reduced by 1, wherein the apparatus is configured for decoding, from the data stream, a third difference between a rank of the predetermined position and an integer-rounded half of the number of integer values;

calculating the predetermined position based on the third difference and the number of integer values, wherein the apparatus is configured for decoding from the data stream the third difference via an exponential Golomb code.

2. The apparatus according to claim 1, configured for decoding from the data stream the number of integer values of the sequence of integer values.

3. The apparatus according to claim 2, configured for decoding from the data stream the number of integer values of the sequence of integer values by use of a variable length code.

4. The apparatus according to claim 1, configured for decoding from the data stream an information revealing the predetermined position.

5. The apparatus according to claim 1, configured for, for each position of the sequence of positions which precedes the predetermined position, computing the integer value at the respective position by linearly combining the first difference, the integer value residing immediately following the respective position and one; and for each position of the sequence of positions which is located following the predetermined position, computing the integer value at the respective position by linearly combining the second difference, the integer value residing immediately preceding the respective position and one.

6. The apparatus according to claim 1, configured for decoding from the data stream the third difference via a variable length code.

7. The apparatus according to claim 1, configured for decoding from the data stream the predetermined integer value via a variable length code.

8. The apparatus according to claim 1, configured for decoding from the data stream the predetermined integer value by decoding an unsigned integer via a variable length code; and retrieving the predetermined integer value by inverse mapping from the unsigned integer according to a predefined inverse mapping rule.

9. The apparatus according to claim 8, wherein the inverse mapping rule maps unsigned integers to signed integers in a manner so that even unsigned integers and odd un signed integers are mapped onto separate ones of signed integers lower than 0 and signed integers greater than 0, respectively, with mapping zero onto zero and so that, for each signed integer, a first signed integer mapped onto the respective unsigned integer is, in magnitude, larger than or equal to, a second signed integer mapped onto an unsigned integer following the respective unsigned integer.

10. The apparatus according to claim 1, configured for decoding from the data stream the first difference via an exponential Golomb code.

11. The apparatus according to claim 1, configured for decoding from the data stream the second difference via a variable length code.

12. The apparatus according to claim 1, configured for decoding from the data stream the second difference via an exponential Golomb code.

13. The apparatus according to claim 1, wherein the sequence of integer values is a codebook that is associated with parameters of a neural network.

14. The apparatus according to claim 1, configured for reconstructing the decoded sequence of integer values to a plurality of floating point values from a set of quantization levels which are defined by the sequence of integer values and a floating point quantization parameter.

15. The apparatus according to claim 14, configured for decoding from the data stream, for each of the plurality of floating point values, a quantization index pointing to the associated integer value within the sequence of integer values which, according to the floating point quantization parameter, is associated with a quantization level onto which the respective floating point value was quantized.

16. The apparatus according to claim 15, configured for decoding the quantization index from the data stream based on a rank difference of a first rank of the position of the associated integer value within the sequence of integer values and the rank of the predetermined position.

17. The apparatus according to claim 15, configured for decoding from the data stream the rank difference by debinarizing the number using a binarization code from a binary string of one or more bins and context-adaptive binary arithmetic decoding the one or more bins.

18. An apparatus for encoding, into a data stream, a sequence of integer values which are ordered in a strict monotonous manner, the apparatus configured for encoding into the data stream a predetermined integer value located at a predetermined position of the sequence of integer values; and for a position of the sequence of integer values which precedes the predetermined position, calculating a first difference between an integer value residing immediately following the respective position and the integer value at the respective position, reduced by 1; and encoding the first difference into the data stream; and for each position of the sequence of integer values which is located following the predetermined position, calculating a second difference between the integer value at the respective position and an integer value residing immediately preceding the respective position, reduced by 1; and encoding the second difference into the data stream, wherein the apparatus is configured for calculating a third difference between a rank of the predetermined position and an integer-rounded half of the number of integer values, encoding the third difference into the data stream, wherein the apparatus is configured for encoding into the data stream the third difference by use of an exponential Golomb code.

19. A method for decoding, from a data stream, a sequence of integer values which are ordered in a strict monotonous manner, comprising decoding from the data stream a predetermined integer value located at a predetermined position of the sequence of integer values; and for a position of the sequence of integer values which prior to the predetermined position, decoding, from the data stream, a first value indicative of a first difference between an integer value immediately following the position of the sequence of integer values prior to the predetermined position and an integer value at the position of the sequence of integer values prior to the predetermined position minus one; and for a position located following the predetermined position in the sequence of integer values, decoding, from the data stream, a second difference between the integer value at the respective position and an integer value residing immediately preceding the respective position, reduced by 1, the method further comprising:

decoding, from the data stream, a third difference between a rank of the predetermined position and an integer-rounded half of the number of integer values;

calculating the predetermined position based on the third difference and the number of integer values, wherein the apparatus is configured for decoding from the data stream the third difference via an exponential Golomb code.

* * * * *